US008648746B2

(12) United States Patent  
Poprawa et al.

(10) Patent No.: US 8,648,746 B2  
(45) Date of Patent: Feb. 11, 2014

(54) NETWORK ANALYZER WITH AN N-PORT NETWORK HAVING AT LEAST TWO PORTS FOR MEASURING THE WAVE PARAMETERS OF A MEASUREMENT OBJECT

(75) Inventors: Florian Poprawa, München (DE); Andreas Schicht, Erlangen (DE); Claus Seisenberger, Neufrannhofen (DE); Andreas Ziroff, Passau (DE)

(73) Assignee: Siemens Aktiengesellschaft, München (DE)

( * ) Notice: Subject to any disclaimer, the term of this patent is extended or adjusted under 35 U.S.C. 154(b) by 305 days.

(21) Appl. No.: 13/262,255

(22) PCT Filed: Feb. 25, 2010

(86) PCT No.: PCT/EP2010/052372
§ 371 (c)(1),
(2), (4) Date: Sep. 30, 2011

(87) PCT Pub. No.: WO2010/112277
PCT Pub. Date: Oct. 7, 2010

(65) Prior Publication Data
US 2012/0032837 A1  Feb. 9, 2012

(30) Foreign Application Priority Data

Apr. 2, 2009  (DE) .......................... 10 2009 016 028

(51) Int. Cl.
*G01S 13/58* (2006.01)
(52) U.S. Cl.
USPC ............ 342/175; 342/109; 342/111; 342/192

(58) Field of Classification Search
USPC .............. 342/59, 99, 109, 111, 116, 175, 192
See application file for complete search history.

(56) References Cited

U.S. PATENT DOCUMENTS

| 6,157,183 | A | * | 12/2000 | Bradley | ..................... 324/76.23 |
| 6,348,804 | B1 | | 2/2002 | Evers | |
| 2004/0066182 | A1 | | 4/2004 | Boss et al. | |
| 2004/0196177 | A1 | | 10/2004 | Billington et al. | |
| 2004/0257092 | A1 | | 12/2004 | Verspecht | |
| 2012/0032837 | A1 | * | 2/2012 | Poprawa et al. | ............... 342/189 |

FOREIGN PATENT DOCUMENTS

| CN | 101387671 A | 3/2009 |
| DE | 19705769 A1 | 8/1998 |
| DE | 19926454 A1 | 12/2000 |
| DE | 10246700 A1 | 4/2004 |
| DE | 102006033461 A1 | 1/2008 |

(Continued)

*Primary Examiner* — John B Sotomayor

(57) ABSTRACT

A network analyzer includes an n-port network with two ports for measuring wave parameters of a measurement object. Each port has a feed for a radio-frequency signal from a signal source. Signal components of the radio-frequency signal fed into the respective port are reflected at the measurement object and the signal components of one or more radio-frequency signals fed into at least one other port are transmitted through the measurement object to the respective port are measured as wave parameters. The two ports are supplied with different radio-frequency signals, wherein frequencies or frequency bands are offset with respect to one another by a frequency offset. Reflected and transmitted signal components of the radio-frequency signals are measured at the same time at the two ports.

16 Claims, 3 Drawing Sheets

(56) References Cited

FOREIGN PATENT DOCUMENTS

| | | | |
|---|---|---|---|
| DE | 102007009739 A1 | | 9/2008 |
| EP | 0962783 A2 | | 12/1999 |
| EP | 2042830 A1 | * | 4/2009 |
| JP | 2000055957 A | | 2/2000 |
| JP | 2001013181 A | | 1/2001 |
| JP | 2004132985 A | | 4/2004 |
| JP | 2011127605 A | * | 6/2011 |
| WO | WO 2008009717 A1 | * | 1/2008 |

* cited by examiner

NETWORK ANALYZER WITH AN N-PORT NETWORK HAVING AT LEAST TWO PORTS FOR MEASURING THE WAVE PARAMETERS OF A MEASUREMENT OBJECT

CROSS-REFERENCE TO RELATED APPLICATIONS

This application is the US National Stage of International Application No. PCT/EP2010/052372 filed Feb. 25, 2010, and claims the benefit thereof. The International Application claims the benefits of German Patent Application No. 10 2009 016 028.0 DE filed Apr. 2, 2009. All of the applications are incorporated by reference herein in their entirety.

FIELD OF INVENTION

The invention relates to a network analyzer with an n-port device having at least two ports for measuring the wave parameters of a measurement object and also a corresponding method for measuring parameters of a measurement object with the aid of a network analyzer of this type.

BACKGROUND OF INVENTION

Network analyzers with n-port devices are used for measuring and therefore characterizing measurement objects by way of their wave parameters. These wave parameters, which are also referred to as s-parameters or scattering parameters, specify in this respect, with regard to a respective port of an n-port device, how much of the power fed in to the respective port is reflected at the measurement object or transmitted to another port. To this end, conventional network analyzers are supplied with a radio-frequency signal, the reflection and transmission being measured sequentially at each port of the n-port device. This means that only one of the ports is supplied with a radio-frequency signal during each measurement, the reflected component being measured at that port to which the radio-frequency signal is applied and the transmitted component at a minimum of one other port. Measurement of the reflection and transmission for all ports at the same time is not possible in this respect since this results in the superimposition of the corresponding frequency spectra for the reflection and the transmission. Consequently, conventional network analyzers cannot be employed for dynamic measurement objects that change rapidly over time, since the measured scattering parameters change very rapidly due to the dynamics of the measurement object and therefore measurement of all the scattering parameters at the same time is required.

SUMMARY OF INVENTION

An object of the claimed invention is to create a network analyzer and a corresponding measuring method for measuring scattering parameters of a dynamic measurement object.

This object is achieved by a network analyzer and a measuring method according to the independent claims. Further developments of the claimed invention are defined in the dependent claims.

The inventive network analyzer includes an n-port device with at least two ports, wherein each port has a feed for a radio-frequency signal from a signal source, and that signal component of the radio-frequency signal fed in to the respective port which is reflected at the measurement object and that signal component of one or more radio-frequency signals fed in to at least one other port which is transmitted by the measurement object to the respective port can be measured as wave parameters of a respective port. In this respect, 'radio-frequency signal' means in particular a signal with a frequency from 100 kHz upward into the range of a few hundred GHz.

The inventive network analyzer is characterized in that the said at least two ports of the n-port device are supplied, during operation of the network analyzer, with different radio-frequency signals, the frequencies or frequency bands of which are offset with respect to one another by a frequency offset, the reflected and transmitted signal components of the radio-frequency signals being measured at the same time at the said at least two ports. The invention is based on the finding that a suitable separation of the spectra of the reflected and transmitted signal components can be achieved by means of a corresponding frequency offset, so that all scattering parameters of a plurality of ports can be measured at the same time. In this way, measurement objects that are rapidly changing dynamically can be captured. In this respect, the changing scattering parameters of the measurement object over time can be measured continuously. This type of measurement of dynamic measurement objects is not possible with conventional network analyzers due to the sequential measurement of the scattering parameters.

In a preferred embodiment of the inventive network analyzer, the frequency offset between the radio-frequency signals is sufficiently large in this respect so that, with regard to each port, the frequency spectra measured for the reflected and transmitted signal components do not overlap. This can be achieved by ensuring that the difference between the frequencies is at least as large as the sum of the maximum frequency deviation of the reflection spectrum from the corresponding carrier frequency and the maximum frequency deviation of the transmission spectrum from the corresponding, albeit offset by the frequency offset, carrier frequency. In this way, a clear separation is ensured between the two frequency spectra. Nevertheless, an overlapping of the frequency spectra can also be permitted where relevant, in particular if only specific components of the frequency spectra are of interest in the measurement being carried out.

In order to prevent, as far as possible, any distortion of the measurement in the event of a frequency dependence of the scattering parameters, the frequency offset between the radio-frequency signals is not selected too large in a preferred embodiment. In one variant, the frequency offset is therefore smaller than the smallest and/or largest frequency or center frequency of the frequency band of the different radio-frequency signals. For example, the frequency offset can be less than or equal to 50%, and preferably less than or equal to 25%, and particularly preferably less than or equal to 10% of the smallest and/or largest frequency or center frequency of the frequency band of the different radio-frequency signals.

In a particularly preferred embodiment, supplying of the ports with different radio-frequency signals is achieved in that, with regard to each port of the said at least two ports, a separate signal source is provided for supplying the port.

In a further, particularly preferred version of the invention, with regard to each port of the n-port device, a mixer is provided for mixing the radio-frequency signal fed in to the respective port with the reflected and transmitted signal components. In this way, the corresponding information can be extracted from the reflected and transmitted signal components, in particular in the form of corresponding I-parameters and Q-parameters, from which the amplitude and phase of the signals are produced.

In a further, preferred embodiment of the inventive network analyzer, each port of the n-port device includes a waveguide supplied via a separate radar, the operating frequencies of the radars differing from each other by the frequency offset. With regard to specific applications, for example for measuring the scattering parameters of rotating vanes of a gas turbine, the operation of one of the radars at a frequency of 80 GHz and another of the radars at 80.01 GHz, i.e. with a frequency offset of 10 MHz, has proved useful.

Alongside the network analyzer described above, the invention further relates to a measuring device, which includes a network analyzer of this type. In this respect, the measuring device contains not only the network analyzer but also an evaluation unit for determining one or more further parameters of the measurement object from the wave parameters measured by the network analyzer. For example, the evaluation unit can determine the distance of the measurement object from the n-port device and/or the relative speed of the measurement object with reference to the n-port device from the wave parameters as further parameters during operation. In this respect, corresponding methods for determining physical variables, such as distance and speed, from the wave parameters of an object are sufficiently known from the state of the art. The measuring device can be employed for example in the aforementioned application for measuring the scattering parameters of the turbine vanes of a gas turbine. In this case, the radial distance of the turbine vanes from the internal wall of the turbine housing in particular, or the relative speed of the turbine vanes with reference to the internal wall, is determined.

Alongside the network analyzer described above and a measuring device based thereon, the invention further relates to a method for measuring parameters of a measurement object with the aid of the inventive network analyzer. In this respect, the said at least two ports of the n-port device of the network analyzer are supplied with different radio-frequency signals, the frequencies or frequency bands of which are offset with respect to one another by a frequency offset, and the reflected and transmitted signal components of the radio-frequency signals are measured at the same time at the said at least two ports. In a preferred version, the wave parameters are evaluated with the aid of an evaluation unit in this respect to determine further parameters of the measurement object. By analogy with the aforesaid measuring device, the distance of the measurement object from the n-port device and/or the relative speed of the measurement object with reference to the n-port device can be determined from the wave parameters as further parameters in this respect. As already mentioned above, a measuring method of this type is suitable for measuring properties of the rotating vanes of a gas turbine. In this case, the n-port device is preferably arranged on the internal wall of the turbine housing in the rotational plane of the vanes, the radial distance between the internal wall and the vanes being determined from the wave parameters measured with the aid of the network analyzer.

BRIEF DESCRIPTION OF THE DRAWINGS

In the following, exemplary embodiments of the invention are described in detail on the basis of the enclosed figures. These show.

DETAILED DESCRIPTION OF INVENTION

Figure 1:
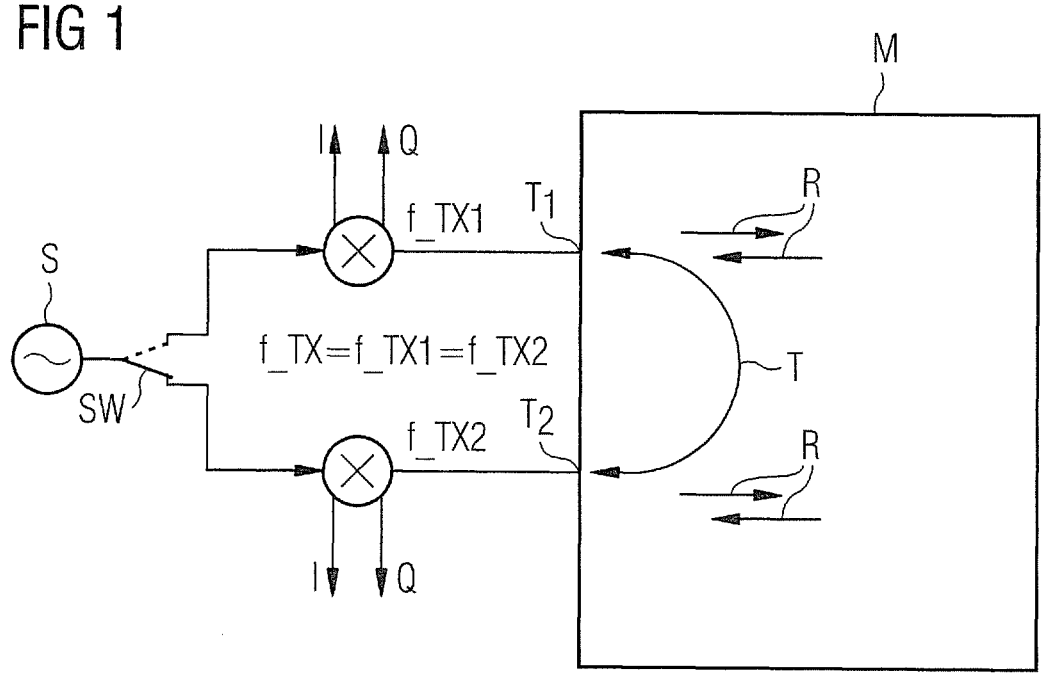
FIG. 1 A schematic representation of a network analyzer according to the state of the art.

FIG. 1 shows a schematic representation of a network analyzer with a conventional n-port circuit. The analyzer includes a radio-frequency signal source S, which emits a radio-frequency signal with the frequency f_TX. This signal is fed via a switch SW to one of two signal branches in each case, each signal branch representing a port T1 or T2, which is formed by means of the passage of the respective signal branch to a measurement object M. In this respect, the measurement object M can be regarded as an object with unknown properties in the nature of a black box and is therefore indicated in the form of a rectangle. Now the aim of the measurement carried out with the aid of the network analyzer is to ascertain the wave parameters of the measurement object M via the ports T1 or T2. These wave parameters, which are also referred to as s-parameters or scattering parameters, indicate how much of the power fed in to a port is reflected or transferred from the one port to the other port and therefore transmitted. In this respect, the reflection at the ports T1 or T2 is reproduced by means of arrows R, whereas the transmission from the one port to the other port is indicated by a semicircular double arrow T.

An I/Q mixer MI1 or MI2 is provided in each signal branch of the two ports T1 and T2, which mixes the signal received from the respective port with the original radio-frequency signal, in order to determine the signal components modulated on to the radio-frequency signal by this means. The carrier frequency is the same for both mixers due to the feed being effected by the same radio-frequency source S, i.e. f_TX1 of the mixer MI1 is identical to f_TX2 of the mixer MI2 and corresponds to the frequency f_TX of the radio-frequency source S. The corresponding I-signals or Q-signals for the reflection or the transmission are then obtained via the mixer for each measurement, from which the frequency spectrum of the signal components can then be determined.

In the network analyzer according to FIG. 1, measurement of the scattering parameters is effected sequentially for each of the ports. To this end, the radio-frequency source S is first connected by means of the switch SW to the port T1, following which the reflection at the said port and also the transmission from the port T1 to the port T2 can be ascertained. Then the switch SW is changed over so that the port T2 is connected to the radio-frequency source S, following which the reflection at the port T2 and the transmission of the signal from the port T2 to the port T1 is measured. In the case of measurement of a dynamic object whose state changes rapidly, it is frequently desirable for the scattering parameters of each port to be ascertained at the same time since consecutive determination of the scattering parameters results in incorrect measurement results due to the dynamic changes in the properties of the measurement object.

Figure 2:
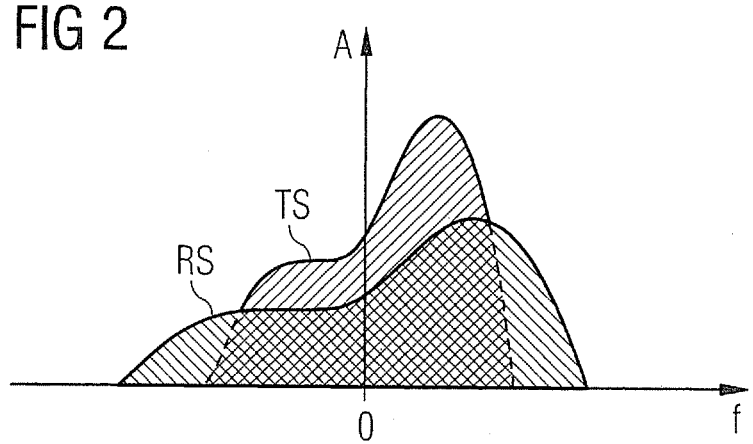
FIG. 2 An exemplary reproduction of the reflection and transmission spectra that are obtained in the case of simultaneous measurement of both spectra with the aid of the analyzer in FIG. 1.

However, if the scattering parameters for both ports are measured at the same time with the network analyzer in FIG. 1, i.e. if both ports T1 and T2 are connected to the signal source S at the same time, a signal is obtained whose spectrum does not allow any conclusion about the individual transmission or reflection parameters of the ports. This is made clear in FIG. 2, which shows, by way of example, a frequency spectrum measured for one of the ports in the case of both ports being measured at the same time. In this respect, the frequency f of the signals is plotted on the abscissa and the amplitude A on the ordinate. Since, in the case of measurement via both ports at the same time, a signal with the same frequency is emitted, the received signal components for the reflection and the transmission at a port are converted into the same frequency band. As can be seen from FIG. 2, a superimposition of the reflection spectrum RS and the transmission spectrum TS is therefore produced for the signal components. That is to say, the output spectrum is the sum of the two spectra RS and TS, from which it is no longer possible to work backward to the spectrum RS or TS. The complex signal present at the output of the corresponding mixer does not therefore permit the information about the transmission to be separated from the reflection.

Figure 3:
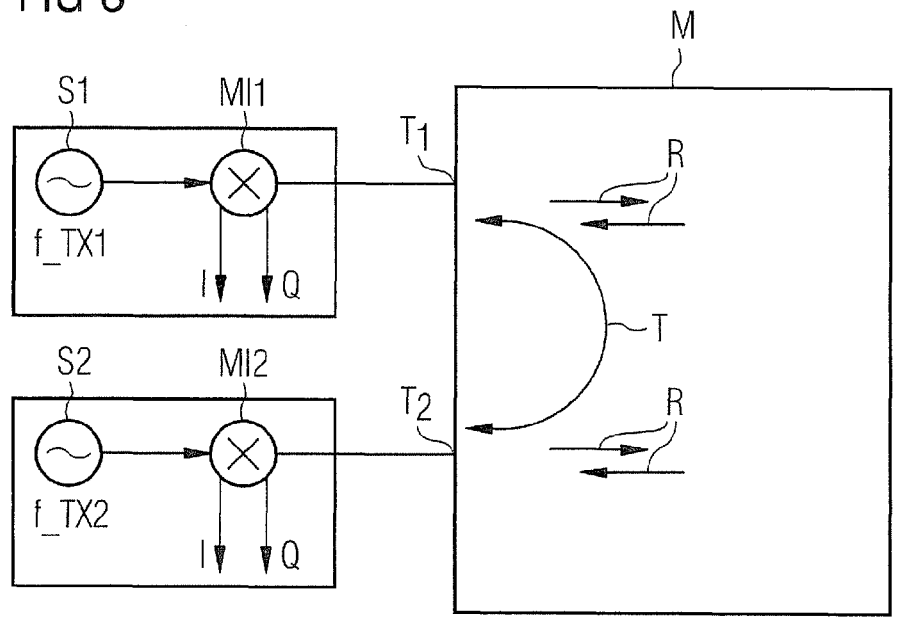
FIG. 3 A schematic representation of a network analyzer according to an embodiment of the invention.

FIG. 3 shows a schematic representation of an embodiment of the inventive network analyzer. By analogy with the network analyzer in FIG. 1, this analyzer in turn includes two ports T1 and T2, to which corresponding mixers MI1 and MI2 are assigned for ascertaining the I/Q-parameters of the signal components reflected or transmitted by the measurement object. In this respect, the measurement object is indicated as a rectangle M by analogy with FIG. 1. The corresponding reflections or transmissions are likewise reproduced by means of the same arrows R or T.

Now, in contrast to the analyzer in FIG. 1, the analyzer according to FIG. 3 includes two radio-frequency sources S1 and S2. In this respect, the radio-frequency source S1 supplies the port T1 and the radio-frequency source S2 the port T2. The radio-frequency source S1 works at the operating frequency f_TX1, whereas the radio-frequency source S2 works at a different operating frequency f_TX2, which is offset with respect to the operating frequency f_TX1 of the source S1.

Figure 4A:
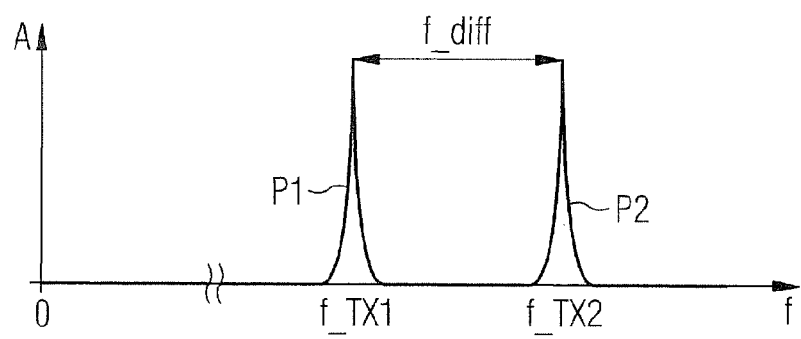
FIGS. 4A and 4B Frequency spectra of the radio-frequency sources used in the network analyzer in FIG. 3 and the reflected and transmitted signal components received in the network analyzer respectively.

In this respect, the supplying of different frequencies to the ports is reproduced in FIG. 4A. This graph, in which the signal amplitude A is plotted over the frequency f, shows the frequency spectrum P1 of the radio-frequency source S1 and the frequency spectrum P2 of the radio-frequency source S2. It can be seen that each spectrum consists of a corresponding peak at the frequency f_TX1 or f_TX2, the two frequency spectra being spaced apart by the offset f_diff. Now, due to the frequency offset, measurement of the reflected and transmitted signal components can be effected at both ports T1 and T2 at the same time.

Figure 4B:
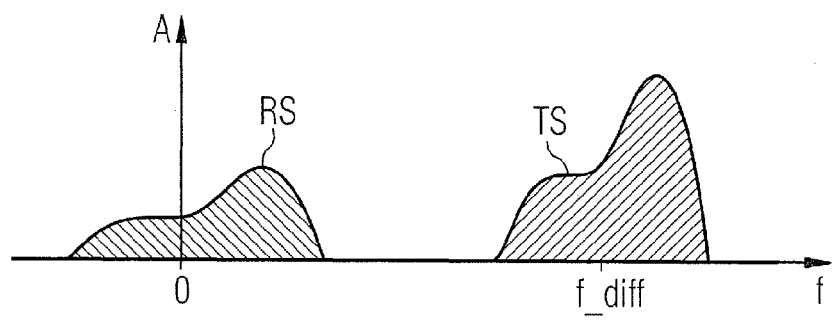

In the case of a measurement of this type, the mixer MI1 ascertains the reflected component of the radio-frequency signal emitted by the port T1 and also the transmitted component of the radio-frequency signal emitted by the port T2 with reference to the base band of the frequency f_TX1. Similarly, the mixer MI2 ascertains the reflected component of the radio-frequency signal emitted by the port T2 and also the transmitted component of the radio-frequency signal emitted by the port T1 with reference to the base band of the frequency f_TX2. Now, due to the frequency offset, the spectra of the reflected and transmitted components are spaced apart, as is made clear by the frequency spectrum for one of the ports in FIG. 4B, by way of example. In this respect, it is ensured, by means of suitable selection of the offset, that the frequency spectrum of the reflected signal component RS does not overlap with the frequency spectrum of the transmitted signal component TS since the two spectra are offset from each other by f_diff.

To keep any influences on the spectra that are caused by the different carrier frequencies as small as possible, the two spectra lie as close as possible to each other but without overlapping, in a preferred embodiment. The frequency offset should therefore be at least as large as the sum made up by the maximum deviation of the frequency spectrum for the carrier frequency f_TX1 and the maximum deviation of the frequency spectrum for the carrier frequency f_TX2. It is therefore ensured by means of the network analyzer in FIG. 3, due to the frequency offset, that the conversion of the signal components for the reflection and the transmission is effected in to different frequency bands of the output spectrum of the respective mixer. In this respect, the reflection is mapped in to the corresponding base band of the mixer, whereas the transmission is located at the carrier frequency that constitutes the difference frequency between the send signals of the radio-frequency sources S1 and S2. This gives rise to two different frequency spectra that can be measured simultaneously and continuously for each port. In this way, dynamic measurement objects that change rapidly over time can be fully captured.

Figure 5:
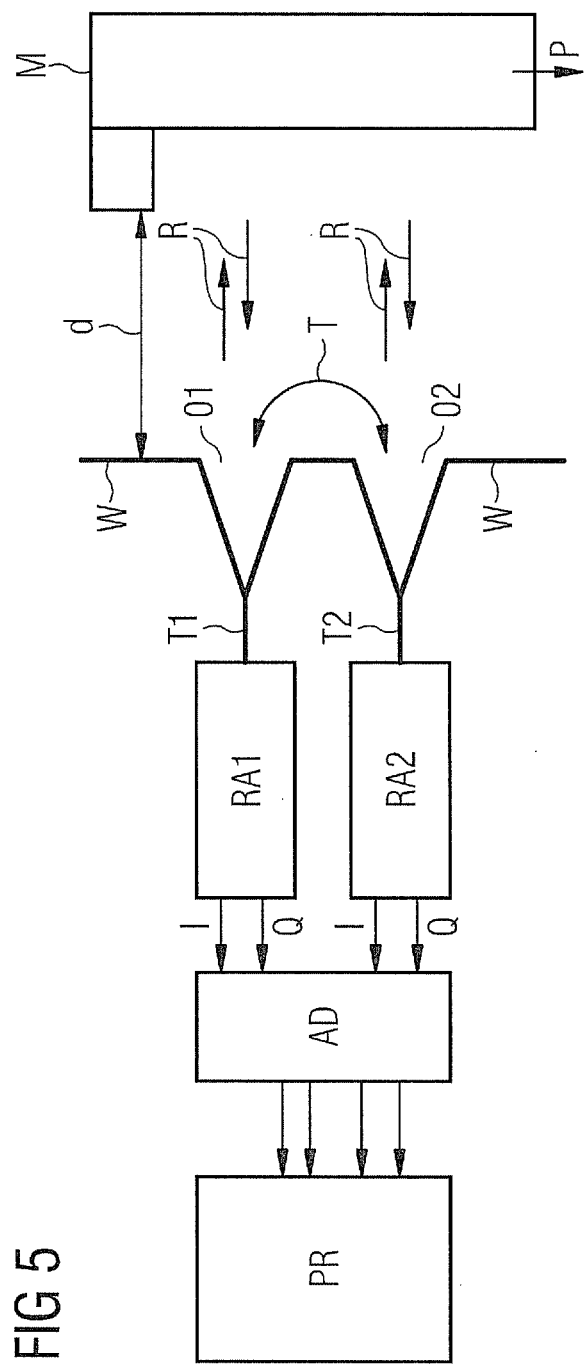
FIG. 5 A schematic representation of an embodiment of an inventive measuring device for determining the distance of the turbine vanes of a gas turbine from the internal wall of the turbine housing.

FIG. 5 shows an example of the use of an inventive network analyzer in a measuring system for ascertaining the radial gap between the turbine vanes of a gas turbine and the internal wall of the corresponding turbine housing. In this respect, a section of a turbine vane is designated as the measurement object M in FIG. 5, this vane moving in the direction of the arrow P in the plane of the page. In this respect, a section of the turbine vane is shown that lies adjacent to the internal wall of the turbine housing within which the vane moves. In this respect, sections of this wall are designated by the reference symbol W in FIG. 5. Now, the aim is to employ a network analyzer in order to measure the radial gap d between the rapidly moving turbine vanes and the wall W, in order to detect any out-of-balance conditions arising and counteract damage to the turbine due to contact between the turbine vanes and the wall.

Once again, a network analyzer with two ports T1 and T2 is used for the measurement, the ports being formed by corresponding waveguides that terminate in funnel-shaped openings O1 and O2 in the turbine wall W. Similarly to FIG. 3, the reflections or transmissions of the signals emitted via the waveguides are indicated by means of corresponding arrows R or T. In this respect, each waveguide has a radar sensor RA1 or RA2 assigned to it. By analogy with FIG. 3, the radar sensor RA1 contains a corresponding radio-frequency source S1 and a mixer MI1 The radar sensor RA2 likewise contains a corresponding radio-frequency source S2 and a corresponding mixer MI2. In this respect, the radio-frequency sources and the mixers are not reproduced again in FIG. 5.

The two radar sensors work at different operating frequencies that are spaced apart by a predetermined frequency offset, which is achieved by means of the different frequencies of the radio-frequency sources S1 and S2 in accordance with FIG. 3. In this respect, the transmission and reflection of the radio-frequency signals emitted via the waveguides of the ports are measured at the same time. With regard to the application shown in FIG. 5, a CW radar in particular is used (CW=Continuous Wave), which works at an operating frequency of 80 GHz in the sensor RA1 and at an operating frequency of 80.01 GHz in the sensor RA2. That is to say that the two operating frequencies are offset from each other by 10 MHz. The embodiment in FIG. 5 therefore produces simultaneously corresponding I/Q-parameters both for the transmission and also the reflection at each of the two ports. These parameters are digitized in a corresponding A/D converter AD and fed to a digital signal processing system PR.

In the embodiment in FIG. 5, the signal processing system PR takes over the task of ascertaining the size of the radial gap d between the turbine vane and the wall. In this respect, methods that are sufficiently known from the state of the art are employed for ascertaining this distance; in particular, the distance can be determined from the frequency spectrum with the aid of the Doppler method. Since corresponding methods for determining the distance d from the scattering parameters of a network analyzer are known, any further description of the signal evaluation is omitted.

Alongside the radial gap, other parameters can also be measured where relevant: for example, the relative speed of the turbine vanes with reference to the wall. Furthermore, the inventive measuring device is not restricted to measurement of the physical variables represented in FIG. 5; rather, other values can also be measured if their changes are expressed in changes in the corresponding scattering parameters of the network analyzer. The essential advantage of the invention with respect to known network analyzers consists in the fact that rapidly changing physical variables of dynamic systems can also be measured in a suitable manner now since simultaneous and continuous measurement of the scattering parameters is made possible.

The invention claimed is:

1. A network analyzer, comprising:
   an n-port device having a first and a second port for measuring wave parameters of a measurement object,
   a first and a second signal source, wherein the first port has a feed for a first radio-frequency signal from the first signal source, and wherein the second port has a feed for a second radio-frequency signal from the second signal source,
   wherein a first signal component of the first radio-frequency signal fed in to the first port, which is reflected at the measurement object, and a second signal component of the second radio-frequency signal fed into the second port, which is transmitted by the measurement object to the second port are measured as wave parameters,
   wherein, during operation of the network analyzer, the two ports of the n-port device are supplied with different radio-frequency signals,
   wherein frequencies or frequency bands are offset with respect to one another by a frequency offset, and
   wherein reflected and transmitted signal components of the radio-frequency signals are measured at the same time at the two ports.

2. The network analyzer as claimed in claim 1, wherein the frequency offset is sufficiently large so that, with regard to each port, a frequency spectra measured for the reflected and transmitted signal components do not overlap.

3. The network analyzer as claimed in claim 1, wherein the frequency offset is smaller than the smallest and/or the largest frequency of the different radio-frequency signals.

4. The network analyzer as claimed in claim 3, wherein the frequency offset is less than or equal to 50% of the smallest and/or largest frequency of the different radio-frequency signals.

5. The network analyzer as claimed in claim 3, wherein the frequency offset is less than or equal to 25% of the smallest and/or largest frequency of the different radio-frequency signals.

6. The network analyzer as claimed in claim 3, wherein the frequency offset is less than or equal to 10% of the smallest and/or largest frequency of the different radio-frequency signals.

7. The network analyzer as claimed in claim 1, further comprising:
   a first mixer for the first port and a second mixer for the second port for mixing the radio-frequency signals fed into the respective port with the reflected and transmitted signal components.

8. The network analyzer as claimed in claim 1, further comprising:
   a first waveguide for the first port and a second waveguide for the second port, wherein the waveguides are supplied via separate radars, and wherein operating frequencies of the radars differ from each other by the frequency offset.

9. The network analyzer as claimed in claim 8, wherein a first radar comprises an operating frequency of 80 GHz and a second radar comprises an operating frequency of 80.01 GHz.

10. A measuring device, comprising:
    a network analyzer, comprising
        an n-port device having a first and a second port for measuring wave parameters of a measurement object,
        a first and a second signal source, wherein the first port has a feed for a first radio-frequency signal from the first signal source, and wherein the second port has a feed for a second radio-frequency signal from the second signal source,
        wherein a first signal component of the first radio-frequency signal fed in to the first port, which is reflected at the measurement object, and a second signal component of the second radio-frequency signal fed into the second port, which is transmitted by the measurement object to the second port are measured as wave parameters,
        wherein, during operation of the network analyzer, the two ports of the n-port device are supplied with different radio-frequency signals,
        wherein frequencies or frequency bands are offset with respect to one another by a frequency offset, and
        wherein reflected and transmitted signal components of the radio-frequency signals are measured at the same time at the two ports; and
    an evaluation unit for determining one or more further parameters of the measurement object from the wave parameters measured by the network analyzer.

11. The measuring device as claimed in claim 10, wherein the evaluation unit determines a distance of the measurement object from the n-port device and/or a relative speed of the measurement object with reference to the n-port device.

12. A method for measuring parameters of a measurement object, comprising:
    providing a network analyzer, the network analyzer comprising
        an n-port device having a first and a second port for measuring wave parameters of a measurement object,
        a first and a second signal source, wherein the first port has a feed for a first radio-frequency signal from the first signal source, and wherein the second port has a feed for a second radio-frequency signal from the second signal source,
        wherein a first signal component of the first radio-frequency signal fed in to the first port, which is reflected at the measurement object, and a second signal component of the second radio-frequency signal fed into the second port, which is transmitted by the measurement object to the second port are measured as wave parameters,
    supplying the two ports of the n-port device with different radio-frequency signals, wherein frequencies or frequency bands are offset with respect to one another by a frequency offset, and wherein reflected and transmitted signal components of the radio-frequency signals are measured at a same time at the two ports.

13. The method as claimed in claim 12, wherein the wave parameters are evaluated with an evaluation unit in order to determine further parameters of the measurement object.

14. The method as claimed in claim 13, wherein the evaluation unit determines a distance of the measurement object from the n-port device and/or a relative speed of the measurement object with reference to the n-port device.

15. The method as claimed in claim 12, wherein rotating vanes of a gas turbine are the measurement object.

16. The method as claimed in claim 15, wherein the n-port device is arranged on an internal wall of a housing of a gas turbine in a rotational plane of the vanes and a radial distance between the internal wall and the vanes is determined from the wave parameters measured with the network analyzer.

* * * * *